(12) United States Patent
Summers et al.

(10) Patent No.: US 7,259,547 B1
(45) Date of Patent: Aug. 21, 2007

(54) SYSTEM AND METHOD TO USE DYNAMIC FEEDBACK OF ANALOG TO DIGITAL CONVERTER SAMPLE RATE TO ADAPTIVELY LOCK THE SAMPLE RATE TO INPUT FREQUENCY

(75) Inventors: Kevin Summers, Stanwood, WA (US); Mark E. Hastings, Mukilteo, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 4 days.

(21) Appl. No.: 11/165,726

(22) Filed: Jun. 24, 2005

Related U.S. Application Data

(60) Provisional application No. 60/583,231, filed on Jun. 24, 2004.

(51) Int. Cl.
*G01R 7/00* (2006.01)
(52) U.S. Cl. .................. 324/142; 324/76.11; 324/141
(58) Field of Classification Search ................ 324/141, 324/142, 76.11; 702/57, 60, 64; 341/166
See application file for complete search history.

(56) References Cited

U.S. PATENT DOCUMENTS

| | | | | |
|---|---|---|---|---|
| 5,514,958 | A | * | 5/1996 | Germer ........................ 324/74 |
| 6,662,124 | B2 | * | 12/2003 | Schweitzer et al. ........... 702/65 |
| 6,845,333 | B2 | * | 1/2005 | Anderson et al. ............. 702/65 |
| 2002/0013668 | A1 | * | 1/2002 | Maruyama .................... 702/60 |
| 2003/0042886 | A1 | * | 3/2003 | Gandhi ........................ 324/142 |
| 2003/0197632 | A1 | * | 10/2003 | Rubin et al. ................. 341/141 |
| 2004/0190211 | A1 | * | 9/2004 | Ockert et al. ................. 361/92 |

* cited by examiner

*Primary Examiner*—Ha Tran Nguyen
*Assistant Examiner*—Joshua Benitez

(57) ABSTRACT

A system and method for dynamically lock the sample rate of an analog to digital (ADC) converter to an input frequency. Specifically, a system for measuring power is disclosed. The system includes an ADC converter, a measuring module, an ADC cycle counter, and a calculation block coupled together. The ADC converter samples an analog input line signal. The measuring module measures a predetermined number of line cycles of the analog input line signal. The ADC cycle counter measures an actual sample count of the analog input line signal by the ADC converter over the predetermined number of line cycles. The calculation block determines an error rate between the actual sample count and an ideal sample count that is based on a predetermined over sample rate.

21 Claims, 5 Drawing Sheets

SYSTEM AND METHOD TO USE DYNAMIC FEEDBACK OF ANALOG TO DIGITAL CONVERTER SAMPLE RATE TO ADAPTIVELY LOCK THE SAMPLE RATE TO INPUT FREQUENCY

RELATED UNITED STATES PATENT APPLICATION

This application claims priority to the provisional patent application Ser. No. 60/583,231 now abandoned, entitled "Method to Use Dynamic Feedback of Analog to Digital Converter Sample Rate to Adaptively Lock the Sample Rate to Input Frequency," with filing date Jun. 24, 2004, and assigned to the assignee of the present invention, which is herein incorporated by reference in its entirety.

BACKGROUND OF THE INVENTION

1. Field of the Invention

Embodiments of the present invention relate to the field of power meters. Specifically, embodiments of the present invention relate to locking the sample rate of an analog to digital (ADC) converter to the line frequency of an input signal.

2. Related Art

Electrical power meters (EPMs) are widely used in residences and businesses to measure power consumption. Electrical power meters are known as watt-hour meters. Countries such as India, China, and other populous countries that are quickly industrializing require many EPMs to connect to the newly developed power grids. Other more industrialized countries are moving from mechanical measuring devices to electronic devices in order to measure power more effectively.

Due to the large number power meters being installed, this market has become very cost conscious, so much so that the power meters have become a commodity. In particular in developing countries, cost is a major factor in the decision to choose a power meter. As such, it is very desirable to make the power meter as inexpensive as possible.

Cost is primarily driven by competition since power meters are purchased by power companies and resold to consumers. Power companies evaluate competing designs and choose a cost effective solution based on a feature set and price point.

Power meters need to be accurate to avoid overfilling and undercharging. For example, most customers require a one percent or more of accuracy. Accuracy is driven by national standards that vary in detail from country to country, but are typically one-percent for residential meters. Errors more than one percent can greatly cut into a power distributor's profits.

A power meter measures the consumption of power. Power is the amount of energy consumed in a fixed period of time, as follows in equation 1:

$$\text{Power} = \text{energy/sec} \quad (1)$$

Typically power is measured in watts which is defined as follows in equation 2:

$$\text{Watts} = \text{Joules(energy)/sec(time)} \quad (2)$$

Therefore any power metering device must measure both energy and time to correctly calculate power consumption. Power use is accumulated continuously using a timing marker (e.g., second tick). Therefore, energy calculation and timing measurements must be precisely aligned for correct power accumulation.

In a power meter design, requirements for accuracy extend across a range of line frequencies. Power is measured by sampling voltage and current and from this calculating power use. Around the world, electrical power systems operate at nominal frequencies of 50 Hz and 60 Hz.

However, these frequencies drift and often are not exactly at their desired frequency. In the United States, this drift is small, but in other countries the frequency drift can be substantial. A power meter must track the power signal with its sampling system to maintain accuracy. If left unaccounted for, frequency mismatches between the input signal and the sample rate will cause errors that easily exceed allowable specifications.

Energy calculations are based on line cycle by line cycle accumulation and must be aligned with a related second tick. If this synchronization is ignored, an error exceeding the allowed accuracy of the meter may be easily introduced. Since line cycles are detected with either a peak or zero crossing of the input signal, an error of up to one percent could be present in the frequency calculation on a second by second basis.

Even if the power meter has a very accurate clock, if the sampling system does not track the power system, the power meter may exceed allowable specs. As a result, the power meter must track the power system frequency and adjust its sample clock periodically to minimize this error. Additionally, if the ADC is not synchronized to take a pre-defined integral number of cycles during a single AC power cycle (e.g., 60 cycles in a 60 Hz system), the misalignment may cause errors of up to one percent, which is out of specification tolerance. As a result, to achieve required accuracy in a power meter, it is important to manage the synchronization of ADC sample rate, line frequency detection and second tick.

In a conventional solution, the problem of frequency inaccuracy and errors in ADC sample periods are mitigated by increasing the sample frequency. This limits aliasing (errors due to under sampling) but requires a faster and more expensive ADC converter, which is undesirable in a cost sensitive power meter market.

In other conventional sampling systems, the ADC clock can be adjusted to provide the optimal sampling time. To provide the selectivity required, either a PLL (Phase Locked Loop) or a Direct Digital Synthesis system are used. Either of these systems requires additional (and more expensive) components, thus raising overall system cost, which again is undesirable in a cost sensitive power meter market.

In addition, in conventional solutions, the input line frequency can be measured by either peak detectors or zero crossing comparators to determine line cycle occurrence. Frequency calculation is conventionally determined by a count of line cycles per second. However, the time required to take n samples, where n, the over sample number, is not the same period of one complete input signal cycle, an error of up to one percent will be present in the frequency calculation on a second by second basis. In the case of a 60 Hz signal, the period would be 1/60 or 16.67 mSec.

It would be desirable to have an inexpensive and accurate solution to the problems of accuracy in power meters.

SUMMARY OF THE INVENTION

A system and method for dynamically locking the sample rate of an analog to digital (ADC) converter to an input line frequency. Specifically, in accordance with one embodiment, a system for measuring power is disclosed. The system includes an ADC converter, a measuring module, an ADC cycle counter, and a calculation block coupled together. The ADC converter samples an analog input line signal. The measuring module measures a predetermined number of line cycles of the analog input line signal. The ADC cycle counter measures an actual sample count of the analog input line signal by the ADC converter over the predetermined number of line cycles. The calculation block determines an error rate between the actual sample count and an ideal sample count. The ideal sample count is based on a predetermined over sample rate that achieves accurate measurements of the analog input line signal within specifications.

Additionally, a system for measuring line frequency is disclosed, in accordance with one embodiment of the present invention. The system includes an ADC converter for sampling an analog input line signal. A timer is also included for measuring a period of time. Also, the system includes an ADC cycle counter that is coupled to the ADC converter. The ADC cycle counter counts a number of ADC cycles of the analog input line signal over the time period. The system also includes a calculation block that is coupled to the timer and the ADC cycle counter. The calculation block determines a line frequency of the analog input line signal by dividing the number of ADC cycles counted by the time period, and dividing the result by a predetermined over sample rate. The line frequency is measured after the actual sample rate of the ADC converter is driven to the predetermined over sample rate.

Further, a method for measuring power is also disclosed, in accordance with one embodiment. The method begins by measuring a predetermined number of line cycles of an analog input line signal. An ideal sample count by an ADC converter of the analog input line signal is calculated. The ideal sample count is determined over the predetermined number of line cycles. The ideal sample count is based on a predetermined over sample rate. The method also measures an actual sample count by the ADC converter of the analog input line signal over the predetermined number of line cycles. An error rate is determined between the actual sample count and the ideal sample count. The method drives the actual sample count to the ideal sample count by adjusting the overall sample timing of the ADC converter by a factor proportional to the error rate. For example, if the error rate indicates that the actual sample rate is 10 percent too high, the sample timing to the ADC converter is reduced by ten percent in order to minimize the error rate.

DETAILED DESCRIPTION OF THE INVENTION

Figure 1:
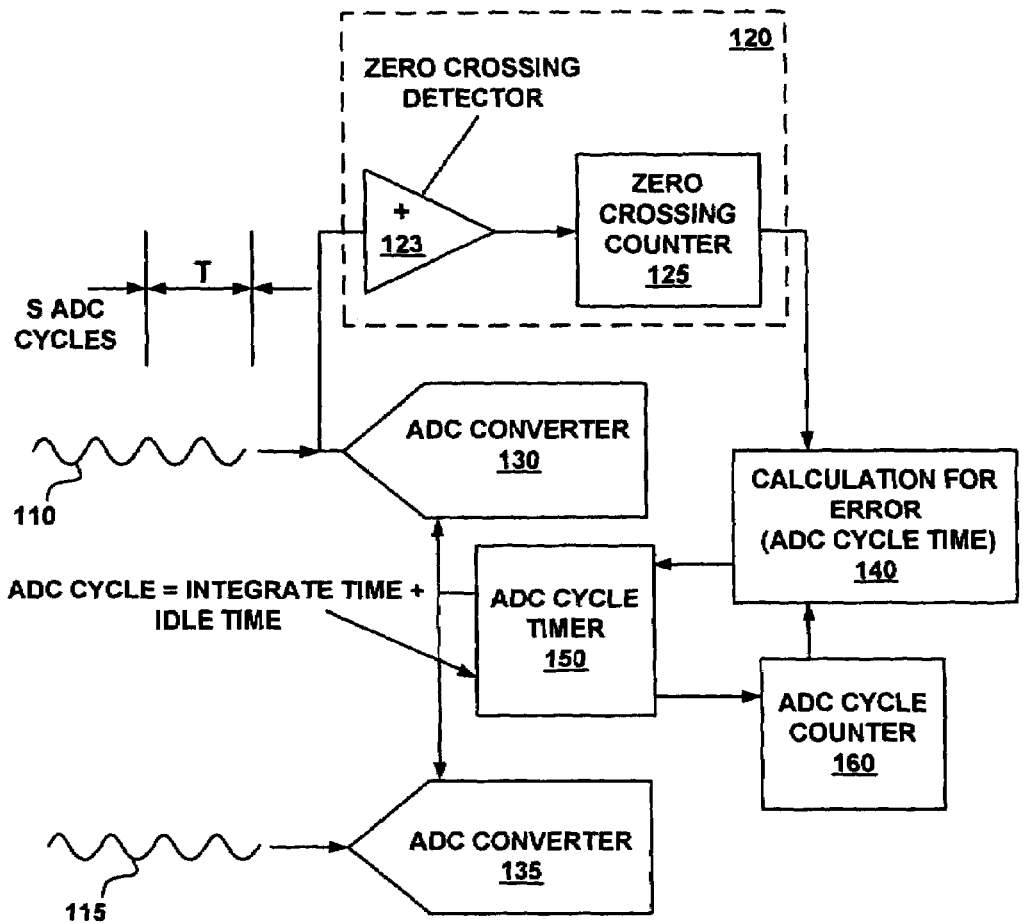
FIG. 1 is a block diagram of a system for measuring power, in accordance with one embodiment of the present invention.

Reference will now be made in detail to the preferred embodiments of the present invention, a system and method for adaptively locking an ADC converter sample rate to an input line frequency, examples of which are illustrated in the accompanying drawings.

Accordingly, various embodiments of the present invention disclose a system and method that rapidly and precisely locks the actual ADC converter cycles per line cycles to the ideal ADC converter cycles per line cycles. Further, embodiments of the present invention are able to achieve the above accomplishments and provide an ADC converter that is able to adaptively lock its sample rate to the input line frequency under potentially changing input conditions. Moreover, embodiments of the present invention are able to achieve the above accomplishments and to allow for an ADC integrate period that does not have to start exactly on a zero crossing, as long as there are an integral number of ADC cycles in a single line cycle. Also, embodiments of the present invention are able to achieve the above accomplishments and to provide for ADC converter optimization across all ADC channels simultaneously since all ADC converters are synchronized from a single master clock. Also, embodiments of the present invention can lock the ADC converter sample rate to the input line frequency without requiring that the zero crossing detector be accurate in sensing the exact zero crossing.

Embodiments of the present invention are disclosed within the context of a programmable system on a chip (PSoC) microcontroller implemented within a power meter. For example, in one embodiment, a power meter on a chip (PMoC) is a single chip design implementing a power energy measurement engine on a single PSoC device. In general, the programmable analog and digital blocks within the PSoC device can be configured to perform various functions, such as modifying the timing of an ADC converter to adaptively lock the sample rate of the ADC converter to the input line frequency. Further, while embodiments of the present invention are described within the context of PSoC devices, other embodiments of the present invention are well suited to other electronic configurations of the power meter.

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "measuring," "calculating," "determining," "driving," or the like, refer to the actions and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

An embodiment of an improved power measurement solution is shown in FIG. 1. FIG. 1 is a block diagram of a system 100 for measuring power, in accordance with one embodiment of the present invention. The improved power measurement solution includes an ADC converter 130 for receiving the analog input line signal 110 (e.g., voltage) and an ADC converter 135 for receiving the analog input line signal 115 (e.g., current). The two ADC converters 130 and 135 combined sample instantaneous voltage and current values for determining power measurements. For example, an accumulation of the multiplied instantaneous voltage and current measurements gives instantaneous real power. For purposes of the present invention, the ADC converter 130 for measuring voltage is used for adaptively locking the ADC converter sample rate to the input line frequency, in accordance with embodiments of the present invention.

Figure 2:
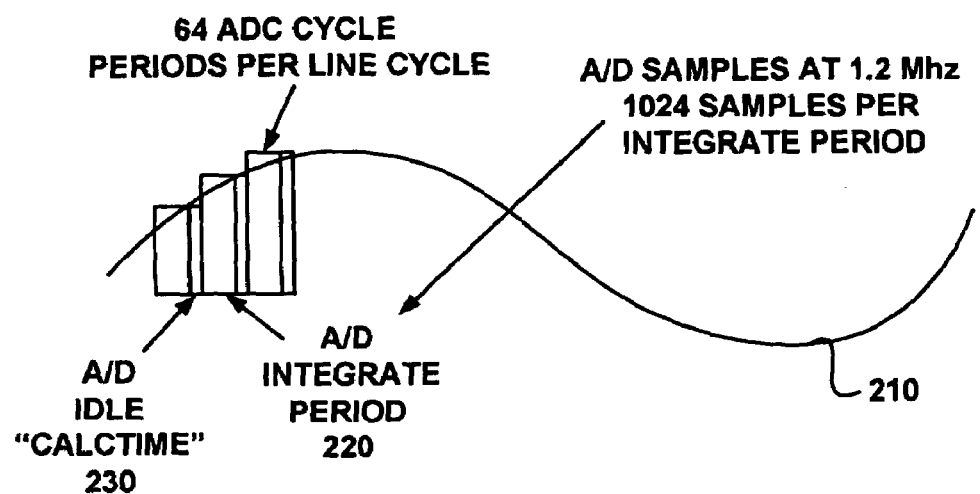
FIG. 2 is an illustration of ADC cycles per line cycle, in accordance with one embodiment of the present invention.

The ADC converter 130 integrates incremental estimates of the analog input line signal 110. As a reference, FIG. 2 is an illustration of the ADC cycles per input line cycle, in accordance with one embodiment of the present invention. As shown in FIG. 2, the ADC converter 130 captures an ideal number of samples of every line cycle of the analog input line signal 210. As an example, in one embodiment, 64 ADC samples are taken per line cycle.

Each ADC cycle, which samples the analog input line signal, includes an ADC integrate period 220 and an ADC idle period 230. The integrate period 220 is fixed for a given ADC converter resolution (e.g., integrate time is set to 1024 ADC clocks). The ADC idle period 230 allows a computation system to acquire the resultant data.

To increase system accuracy, a fixed number of ADC cycles is desired for each line signal frequency cycle (one period), in accordance with one embodiment of the present invention. As such, the ADC sample period of the ADC cycle and the line frequency are inversely proportional to each other.

As will be discussed in full below, the ADC idle period 230 can be adjusted to vary the overall ADC sample timing of the ADC converter 130 by embodiments of the present invention. In this way, the ADC sample rate can be increased or decreased at the end of every line cycle to ensure that the same integral number of ADC integrate periods, or ADC cycles, sample the line cycle. The ability to adjust the sample rate of the ADC converter 130 allows embodiments of the present invention to be inherently compatible with line frequencies from approximately 45 Hz to 65 Hz. Equation 3 illustrates that the inverse of the idle period plus the integration period, in time, provides a sample rate, as follows:

$$\text{Sample\_Rate} = \frac{1}{(\text{idle\_period} + \text{integrate\_period})} \quad (3)$$

By reducing the idle period, the sample rate of the ADC converter 130 increases. Conversely, increasing the idle period reduces the sample rate of the ADC converter 130. Embodiments of the present invention are able to adjust the ADC sample rate in increments of less than 0.1 percent. The idle period is adjusted at the end of each ADC cycle for the next ADC sample period, in one embodiment.

In accordance with one embodiment, the timer in the ADC converter 130 is a count-down timer so that the new sample rate is loaded immediately at the end of the next sample. As such, there is no jitter or phase error that may be caused in a conventional phase locked loop based system.

The system 100 also includes a measuring module 120 that is coupled to the ADC converter 130. The measuring module 120 measures a predetermined number of line cycles of the analog input line signal. In this way, an ideal sample count of the analog input line signal over the predetermined number of line cycles can be calculated. The ideal sample count is based on a predetermined over sample rate (e.g., 64 samples per line cycle).

While embodiments of the present invention are disclosed in relation to an over sample rate of 64 ADC cycles per line cycle, other embodiments are well suited to over sample rates greater than or less than 64 ADC cycles per line cycle.

Figure 3:
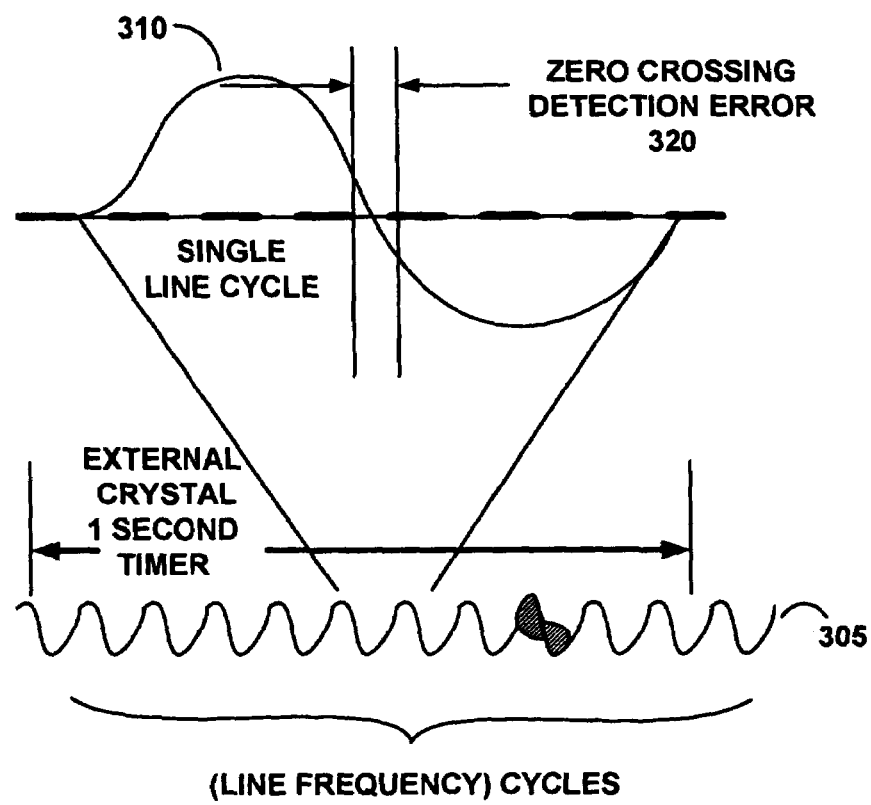
FIG. 3 is an illustration showing the detection of the zero crossings of a single line cycle of an analog input line signal, in accordance with one embodiment of the present invention.

Errors in precise timing of a single input line cycle are minimized by increasing the predetermined number of line cycles. FIG. 3 is an illustration showing the detection of the zero crossings of a single line cycle 310 of an analog input line signal 305, in accordance with one embodiment of the present invention. As shown in FIG. 3, a zero crossing detection error 320 contributes to imprecise measurements of the analog input line signal. However, increasing the number of line cycles in a calibration period beneficially increases error resolution and decreases the effect of zero crossing detection error.

In particular, the measuring module 120 includes a zero crossing detector 123 and a zero crossing counter 125. The zero crossing detector 123 is used to determine the number of line cycles detected by the ADC converter. This is necessary to set the calibration period (a number of line cycles) over which the ADC converter is tested.

In addition, the measuring module 120 includes a zero crossing counter 125 for measuring the predetermined number of line cycles of the analog input line signal. The measuring module 120 counts out the corresponding number of zero crossings associated with the predetermined number of line cycles. In one embodiment, the start of the predetermined number of line cycles begins on a positive swing of the first line cycle counted.

The system 100 also includes an ADC cycle counter 160 that is coupled to the ADC converter through an ADC cycle timer 150. The ADC cycle counter 160 is used to measure an actual sample count by the ADC converter of the analog input line signal over the predetermined number of line cycles. That is, the ADC cycle counter 160 counts the number of ADC cycles generated by the ADC converter 130 during the predetermined number of line cycles.

The system 100 also includes a calculation block 140 coupled to the ADC cycle counter 160 and the measuring module 120. The calculation block determines the error rate between the actual sample count and the ideal sample count. For instance, at the end of the predetermined number of line cycles, the total number of ADC cycles is compared to the number expected based on the line frequency in use. For instance, for an over sample rate of 64 samples per line cycles, 3,840 ADC cycles are expected at 60 Hz, and 3200 ADC cycles are expected at 50 Hz. Embodiments of the present invention are able to determine if the actual sample count matches the ideal sample count. The expected or ideal sample count is determined by multiplying the over sample rate by the predetermined number of line cycles.

The calculation block 140 includes a subtracting block (not shown) for calculating an offset. The offset is determined by subtracting the ideal sample count from the actual sample count. The calculation block 140 also includes a dividing block for diving the offset by the ideal sample count to determine the error rate, as will be illustrated below in an example presented in discussion of FIG. 4.

If the sample count is off, the idle period of the ADC cycle is then adjusted to match the number expected, effectively locking the number of ADC cycles to the expected line frequency, which results in 64 samples per line cycle, in accordance with one embodiment of the present invention. More specifically, the ADC cycle timer 150 drives the actual sample count of ADC cycles to the ideal sample count by adjusting the overall sample timing of the ADC converter by a factor proportional to the error rate. In one particular embodiment, the overall sample timing of the ADC converter is varied by adjusting the idle time of an ADC cycle of the ADC converter by a factor proportional to the error rate, as illustrated below in an example discussed in relation to the flow chart 400 of FIG. 4.

Figure 4:
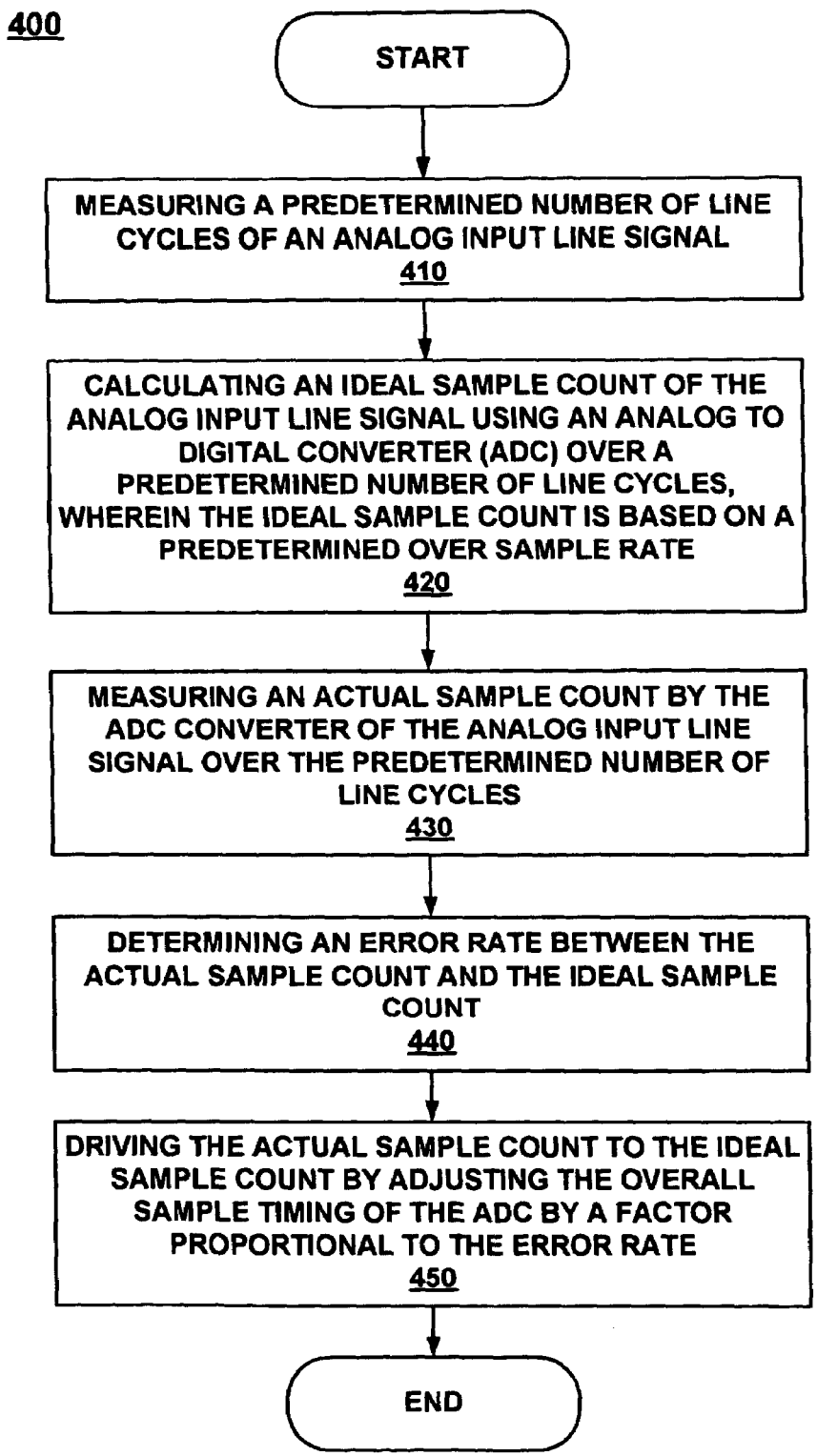
FIG. 4 is a flow chart illustrating steps in a method for measuring power, in accordance with one embodiment of the present invention.

FIG. 4 is a flow chart 400 illustrating steps in a method for measuring power, in accordance with one embodiment of the present invention. The present embodiment is able to increase the accuracy of power measurements by fixing the number of ADC integrate periods by an ADC converter when sampling a line cycle of an analog input line signal.

At 410, the present embodiment measures a predetermined number of line cycles (CCC), representing a calibration cycle count, of an analog input line signal. This is to determine the calibration period over which the present embodiment attempts to lock the sample rate of the ADC converter to the input line frequency. By increasing the predetermined number of line cycles in the calibration period, errors in precise timing of a single input line cycle are minimized.

For instance, in one embodiment, zero crossings of the analog input line signal are detected. The predetermined number of line cycles is measured by counting a corresponding number of zero crossings associated with the predetermined number of line cycles. For example, if the predetermined number of line cycles is ten, then 20 zero crossings are counted after an initial zero crossing on an upswing of the analog input signal to begin the calibration period.

At 420, the present embodiment calculates an ideal sample count by the ADC converter of the analog input line signal. The ideal sample count is determined over the predetermined number of line cycles. The ideal sample count is based on a predetermined over sample rate (OSR), which specifies an integral number of ADC cycles per line cycle. More specifically, the ideal sample count is calculated by multiplying the over sample rate by the predetermined number of line cycles in the calibration period.

The fixed number of ADC cycles in the over sample rate increases system accuracy. As such, the ADC sample period and input line frequency are inversely proportional to each other.

At 430, the present embodiment measures an actual sample count taken by the ADC converter of the analog input line signal. The actual sample count is measured over the predetermined number of line cycles. To achieve the greatest accuracy of the power measurement, the actual sample count should match the ideal sample count to match the frequency between the input signal and the sample rate of the ADC converter.

At 440, the present embodiment determines an error rate between the actual sample count and the ideal sample count. The calculation of the error rate is illustrated in the following example, where the line frequency is approximately 60 Hz. An over sample rate of 64 ADC cycles per line cycle is chosen. The over sample rate is the number of ADC samples taken per single line cycle, in the present example. A calibration cycle count (CCC) presents the predetermined number of line cycles in a calibration period.

In the present example, as an illustration, over a period of 1 second, or 60 line cycles, if the line frequency is exactly 60 Hz, then the ADC converter should sample ideally the analog input line signal 3840 times (e.g., 60 cycles/second*64 samples/cycle). If the actual sample count is not exactly 3840, then the sample rate of the ADC converter should be adjusted. If the actual sample count is too high, the ADC sample rate is also too high. Conversely, if the actual sample count is too low, the ADC sample rate is also too low.

For instance, the ADC cycle time can be adjusted with a tunable idle (calculation) period. As a result, the relationship between the tunable calculation period and the line frequency can be exploited to dynamically adjust the total ADC cycle time to precisely match the input line frequency, thereby increasing system measurement accuracy.

In the present example, the error is calculated by first calculating an offset. The offset is determined by subtracting the ideal sample count from the actual sample count. The error is then calculated by dividing the offset by the ideal sample count to determine the error rate. For instance, equation 4 provides the error rate as a percentage, as follows:

$$\text{Sample Rate Error (\%)} = \frac{(Actual\_Sample\_Count - (OSR * CCC))}{(OSR * CCC)} * 100 \qquad (4)$$

In the present example, if the actual sample rate was measured to be 3700 ADC cycles, the error as calculated for a calibration period of 60 line cycles would be as follows: Sample_Rate_Error (%)=((3700−3840)/3840)*100=−3.6%. Because the error is a negative number, the ADC sample rate is too slow by a factor of 3.6 percent.

At 450, the present embodiment drives the actual sample count by the ADC to the ideal sample count by adjusting overall sample timing of the ADC converter by a factor proportional to the calculated error rate. More specifically, in one embodiment, the idle time of the ADC cycle is adjusted by a factor in proportion with the error rate. For example, the idle time of an ADC cycle is decreased to reduce the ADC cycle in proportion with the error rate when the error rate indicates a sample rate of the ADC is too high. Conversely, the idle time of an ADC cycle is increased to increase the ADC cycle in proportion with the error rate when the error rate indicates a sample rate of the ADC is too low.

In the example presented above, the overall sample rate should be increased by 3.6 percent. Correspondingly, the sample time should be decreased by 3.6 percent. If the integrate period is set to 1024 ADC clocks, and the idle period, to include calculation time, is set to 300 ADC clocks, then the total sample time of the ADC converter is 1324 clocks (1024+300). A reduction of 3.6 percent in the sample time corresponds to 48 clocks (3.6 of 1324). As such, since the integrate period is fixed, the calculation time should be reduced from 300 by 48 ADC clocks to 252 ADC clocks to adjust for the correct sample rate by the ADC converter. This error value can be fed directly back to the ADC cycle time to alter the next period measurement.

In one embodiment, the process as outlined in the flow char 400 of FIG. 4 can be repeated iteratively until the actual sample count matches the ideal sample count, thereby adaptively clocking the ADC sample rate to the input line frequency.

In accordance with another embodiment of the present invention, the error in the ADC cycle time can be expressed as a function of the idle time: Error (ADC cycle time) =f{idle_time}. A new value of the idle_time is fed directly back to the ADC timer (e.g., ADC cycle timer 150 of FIG. 1). As such, for any system with a chosen over sample rate (OSR), some CCC as the predetermined number of line cycles may be chosen so that the error in ADC cycle time can be driven to: +/−(1 ADC clock)*(the number of line cycles in the CCC)*OSR.

For example, the ADC (idle_time) is driven to some number such that it is 1 count too high. The ADC idle time is currently 300 clocks. The CCC is 60 line cycles, and the OSR is 64 ADC cycles per line cycle.

The error in the ADC cycle time over the period defined by CCC is calculated as follows: +1 clock*60*64 3840. Since each ADC cycle is 1324 clocks, using the example described above in relation to FIG. 4, the count of ADC cycles over the CCC will be about three lower than it should be, as follows: 3840/1324=2.90. As such, too many clocks in the idle time will cause too few ADC cycles to be applied over the CCC. This will cause the ADC timing feedback system to decrease the ADC idle time by some quantity to drive the ADC/CCC to a value closer to the ideal value. In this way, the error in ADC cycles for the desired CCC is driven to a maximum as calculated as follows: (ADC cycle error due to 1 idle time clock)/(ideal ADC cycles), as expressed as follows, 2.9/3840=0.75 percent.

In one embodiment of the present invention, ADC converter optimization takes place simultaneously across all ADC channels, since all are synchronized from a single master clock. For instance, in FIG. 1, the ADC converter 135 is optimized with the same settings as implemented within the ADC converter 130 since both ADC converters 130 and 135 are controlled by the ADC cycle timer 150.

Figure 5:
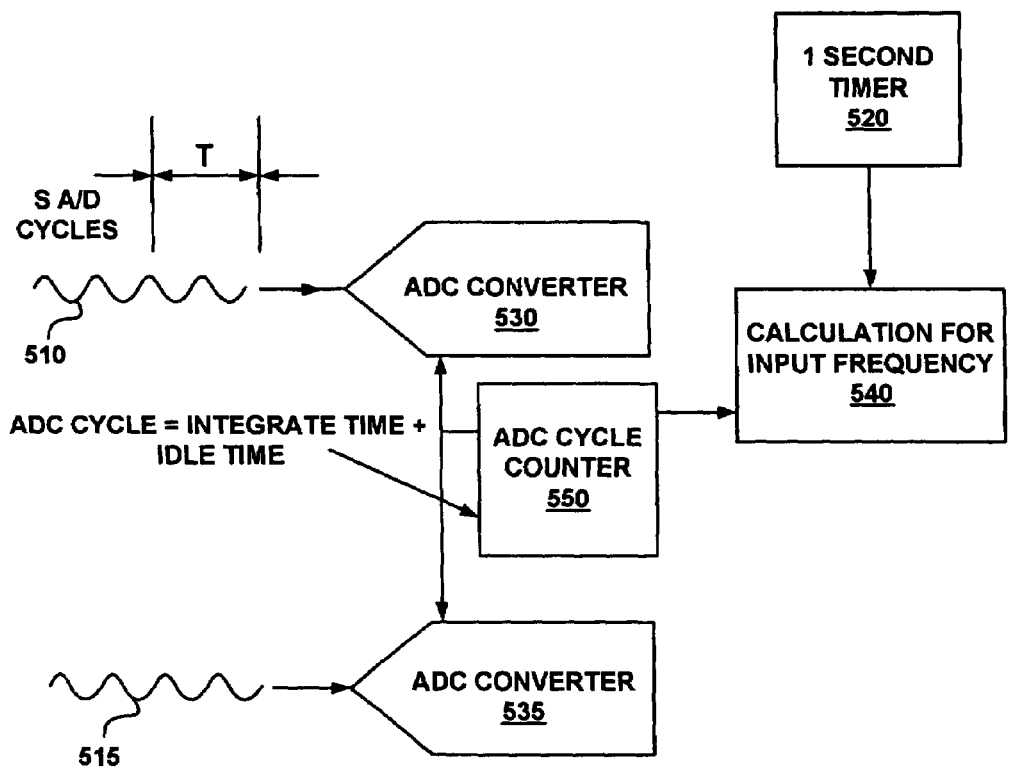
FIG. 5 is a block diagram of a system for measuring line frequency, in accordance with one embodiment of the present invention.

FIG. 5 is a block diagram of a system 500 for measuring line frequency, in accordance with one embodiment of the present invention. The line frequency can be calculated after driving the ADC cycles per line cycle to the over sample rate desired (e.g., 64 ADC cycles per line cycle).

The system 500 includes an ADC converter 530 for receiving the analog input line signal 510 (e.g., voltage) and an ADC converter 535 for receiving the analog input line signal 515 (e.g., current). The ADC converters 530 and 535 are analogous to the ADC converters 130 and 135 of FIG. 1. The ADC converter 530 samples the analog input line signal 510.

The system 500 also includes a timer 520 for measuring a time period. The timer 520 is an external clock. In one embodiment, the timer 520 is a one second timer, where the period is one second.

The system 500 includes an ADC cycle counter 550 that is coupled to the ADC converter 530 for counting a number of ADC cycles of the analog input line signal over the time period (e.g., one second).

A calculation block 540 is coupled to the timer 520 and the ADC cycle counter 550 for determining a line frequency of the analog input line signal. More specifically, the line frequency is determined by the calculation block 540 by dividing the number of ADC cycles by the time period (e.g., one second) or by dividing the number of ADC cycles counted by the predetermined over sample rate. This results in the line frequency, under the condition that the ADC cycle rate matches the line frequency (e.g., 64 ADC cycles per line cycle).

In another embodiment, by counting the ADC cycles based on an external time period (e.g., one second), and using the actual ADC sample rate as determined over the same period in equation 3, the absolute frequency of the input signal can be calculated, as follows in Equation 5:

$$\text{Frequency}=(ADC \text{ cycles})/\text{Sample Rate} \quad (5)$$

The two ADC converters 530 and 535 combine sample instantaneous voltage and current values for determining power measurements. For example, at the completion of each ADC cycle, assigned quantities are acquired representing voltage, phase current, and optionally neutral current. Voltage and phase current are multiplied together and added to a running sum that is accumulated for an entire measurement cycle to determine power consumption as measured by the device, as an example. Other power measurements can also be obtained, but for purposes of clarity are not discussed in the present application.

Accordingly, various embodiments of the present invention disclose a system and method for adaptively locking the sample rate of an ADC converter to an input line frequency. Embodiments of the present invention are capable of automatic documentation generation in embedded processor design, such as the instruction-set manual. As a result, embodiments of the present invention allow for parallel generation of instruction-set documentation during a rapid prototyping design process While the methods of embodiments illustrated in flow chart 400 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a system and method for adaptively locking the sample rate of an ADC converter to an input line frequency are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

What is claimed is:

1. A system for measuring power, comprising:
    an analog to digital (ADC) converter for sampling an analog input line signal;
    a measuring module coupled to said ADC converter for measuring a predetermined number of line cycles of said analog input line signal;
    an ADC cycle counter coupled to said ADC converter for measuring an actual sample count by said ADC converter of said analog input line signal over said predetermined number of line cycles; and a calculation block coupled to said ADC cycle counter and said measuring module for determining an error rate between said actual sample count and an ideal sample count of said analog input line signal over said predetermined number of line cycles, wherein said ideal sample count is based on a predetermined over sample rate.

2. The system of claim 1, wherein said measuring module further comprises:
a zero crossing detector coupled to said ADC converter for detecting zero crossings of said analog input line signal;
a zero crossing counter for measuring said predetermined number of line cycles of said analog input line signal by counting a corresponding number of zero crossings associated with said predetermined number of line cycles.

3. The system of claim 1, further comprising:
an ADC cycle timer for driving said actual sample count to said ideal sample count by adjusting overall sample timing of said ADC by a factor proportional to said error rate.

4. The system of claim 1 further comprising:
an ADC cycle timer for adjusting an idle time of an ADC cycle for said ADC so that said ADC cycle is adjusted in proportion with said error rate.

5. The system of claim 1, wherein said calculation block calculates said ideal sample count by multiplying said over sample rate by said predetermined number of line cycles to calculate said ideal sample count.

6. The system of claim 1, wherein said calculation block further comprises:
a subtracting block for calculating an offset by subtracting said ideal sample count from said actual sample count; and
a dividing block for dividing said offset by said ideal sample count to determine said error rate.

7. The system of claim 1, wherein said calculation block determines a frequency of said analog input line signal by counting a number of ADC cycles for a period of one second and dividing said number of ADC cycles by said predetermined over sample rate.

8. The system of claim 1, further comprising:
another ADC converter, wherein said ADC converters combined measure power of said analog input line signal.

9. A system for measuring line frequency, comprising:
an analog to digital (ADC) converter for sampling an analog input line signal;
a timer for measuring a time period;
an ADC cycle counter coupled to said ADC converter for counting a number of ADC cycles of said analog input line signal over said time period;
a calculation block coupled to said timer and said ADC cycle counter for determining a line frequency of said analog input line signal by dividing said number of ADC cycles by said time period and by dividing said number of ADC cycles by a predetermined over sample rate.

10. The system of claim 9, wherein said time period is one second.

11. The system of claim 9, further comprising:
a measuring module coupled to said ADC converter for measuring a predetermined number of line cycles of said analog input line signal;

said ADC cycle counter for measuring an actual sample count of said analog input line signal by said ADC converter over said predetermined number of line cycles;
said calculation block coupled to said measuring module for determining an error rate between said actual sample count and an ideal sample count of said analog input line signal over said predetermined number of line cycles, wherein said ideal sample count is based on said predetermined over sample rate; and
an ADC cycle timer for driving said actual sample count to said ideal sample count by adjusting overall sample timing of said ADC by a factor proportional to said error rate.

12. The system of claim 9, further comprising:
another ADC converter, wherein said ADC converters combined measure power of said analog input line signal.

13. A method for measuring power, comprising:
measuring a predetermined number of line cycles of an analog input line signal;
calculating an ideal sample count by an analog to digital converter (ADC) of said analog input line signal over said predetermined number of line cycles, wherein said ideal sample count is based on a predetermined over sample rate;
measuring an actual sample count by said ADC of said analog input line signal of said analog input line signal over said predetermined number of line cycles;
determining an error rate between said actual sample count and said ideal sample count; and
driving said actual sample count to said ideal sample count by adjusting overall sample timing of said ADC by a factor proportional to said error rate.

14. The method of claim 13, wherein said measuring a predetermined number of line cycles comprises:
detecting zero crossings of said analog input line signal; and
counting a corresponding number of zero crossings associated with said predetermined number of line cycles.

15. The method of claim 13, wherein said calculating an ideal sample count comprises:
multiplying said over sample rate by said predetermined number of line cycles to calculate said ideal sample count.

16. The method of claim 13, wherein said determining an error rate comprises:
calculating an offset by subtracting said ideal sample count from said actual sample count; and
dividing said offset by said ideal sample count to determine said error rate.

17. The method of claim 13, wherein said adjusting overall sample timing comprises:
adjusting an idle time of an ADC cycle for said ADC so that said ADC cycle is adjusted by said factor in proportion with said error rate.

18. The method of claim 13, wherein said adjusting overall sample timing comprises:
decreasing an idle time of an ADC cycle for said ADC so that said ADC cycle is reduced in proportion with said error rate when said error rate indicates a sample rate of said ADC is too high.

19. The method of claim 13, wherein said adjusting overall sample timing comprises:

increasing an idle time of an ADC cycle for said ADC so that said ADC cycle is increased in proportion with said error rate when said error rate indicates a sample rate of said ADC is too low.

20. The method of claim 13, further comprising:

after said actual sample count is driven to said ideal sample count, counting a number of ADC cycles for a period of one second;

dividing said number of ADC cycles by said predetermined over sample rate to determine a frequency of said analog input line signal.

21. The method of claim 13, further comprising:

determining power of said analog input line signal.

* * * * *